United States Patent [19]

Terada et al.

[11] Patent Number: 5,410,362
[45] Date of Patent: Apr. 25, 1995

[54] TWO-DIMENSIONAL DIGITAL I ×J FILTER OF RANK, R<I, IMPLEMENTED AS DEGENERATED R ×J DIGITAL FILTER

[75] Inventors: Hiroaki Terada, Suita; Makoto Iwata, Takatsuki; Masayuki Mizuno, Kobe, all of Japan

[73] Assignees: H. Terada, Osaka; Mitsubishi Denki Kabushiki Kaisha, Tokyo; Sharp Kabushiki Kaisha, Osaka, all of Japan

[21] Appl. No.: 116,270

[22] Filed: Sep. 3, 1993

[30] Foreign Application Priority Data

Oct. 9, 1992 [JP] Japan .................................. 4-271667

[51] Int. Cl.6 .............................................. G06F 15/31
[52] U.S. Cl. ...................... 348/614; 364/724.16; 364/724.05
[58] Field of Search .................. 358/905; 348/614; 364/724.05, 724.16; G06F 15/31

[56] References Cited

PUBLICATIONS

"The LU Decomposition Theorem and Its Implications to the Realization of Two-Dimensional Digital Filters" by C. L. Nikias et al., IEEE Transaction On ASSP vol. 33 No. 3, Jun. 1985.

*Primary Examiner*—James J. Groody
*Assistant Examiner*—Cheryl Cohen

[57] ABSTRACT

A signal input in a raster scan format is entered into one-dimensional digital filters. An output of the one-dimensional digital filter is multiplied in a multiplier. Outputs of one-dimensional digital filters are provided to delay circuits to generate a time delay in a direction perpendicular to the raster scan direction. The output of the multiplier and the outputs of the delay circuits are added by adders. A one-dimensional digital filter of the vertical direction is decomposed in a manner more simple than in the horizontal direction to reduce delay time between input and output.

10 Claims, 3 Drawing Sheets

$$H_k(Z_1) = \sum_{i=0}^{m-1} h_k(i) Z_1^{-i} \quad : Z_1 \text{ DIRECTION ONE-DIMENSIONAL DIGITAL FILTER}$$

$P = \text{rank}([h(i,j)])$ $L_k(Z_1) = \sum_{i=0}^{m-1} L_k(i) Z_1^{-1} = Z_1$ DIRECTION ONE-DIMENSIONAL DIGITAL FILTER $U_k(Z_2) = \sum_{j=0}^{n-1} U_k(j) Z_2^{-2} = Z_2$ DIRECTION ONE-DIMENSIONAL DIGITAL FILTER

TWO-DIMENSIONAL DIGITAL I ×J FILTER OF RANK, R<I, IMPLEMENTED AS DEGENERATED R ×J DIGITAL FILTER

BACKGROUND OF THE INVENTION

1. Field of the Invention

The present invention relates to two-dimensional digital filters, and more particularly, to a two-dimensional digital filter that is widely used in digital picture signal processing.

Description of the Background Art

The processing content of a two-dimensional digital filter is defined by the following equation (1).

$$H(z_1, z_2) = \sum_{i=0}^{m-1} \sum_{j=0}^{n-1} h(i,j) z_1^{-i} z_2^{-j} = [1\, z_2^{-1}\, z_2^{-2} \ldots z_2^{-n+1}] \begin{bmatrix} h(0,0) & h(0,1) & \ldots & h(0,m-1) \\ h(1,0) & h(1,1) & \ldots & h(1,m-1) \\ h(2,0) & h(2,1) & \ldots & h(2,m-1) \\ \vdots & \vdots & & \vdots \\ h(n-1,0) & h(n-1,1) & \ldots & h(n-1,m-1) \end{bmatrix} \begin{bmatrix} 1 \\ z_1^{-1} \\ z_1^{-2} \\ \vdots \\ z_1^{-m+1} \end{bmatrix} \quad (1)$$

When a signal data is entered in a raster scan manner, the direction of the raster scan (referred to as "horizontal direction" hereinafter) is represented by $z_1$, and the direction perpendicular to the raster scan direction (referred to as "vertical direction" hereinafter) is represented by $z_2$ in the above equation (1). $z_1^{-1}, z_1^{-2}, \ldots, z_1^{-m+1}$ represent delay of order 1, delay of order 2, ..., delay of order (m−1), respectively, in the horizontal direction. Similarly, $z_2^{-1}, z_2^{-2}, \ldots, z_2^{-n+1}$ represent delay of order 1, delay of order 2, ..., delay of order (n−1), respectively, in the vertical direction. A matrix [h (i, j)] is a coefficient representing the properties of a two-dimensional filter.

A method of decomposing a multidimensional digital filter into low dimensional digital filters of a multi-stage separable type is disclosed in "The LU Decomposition Theorem and Its Implications to the Realization of Two-Dimensional Digital Filters", IEEE Transactions on ASSP, 33, No. 3, pp. 694–711 (June 1985) by C. L. Nikias, A. P. Chrysafis, and A. N. Venetsanopoulos.

FIG. 4 shows a structure of a two-dimensional digital filter by LU decomposition. If P is the order (rank ([h (i, j)]) of a matrix [h (i, j)] of equation 1, the two-dimensional digital filter of FIG. 4 includes P one-dimensional digital filters $1_0, 1_1, 1_2, \ldots, 1_{(p-1)}$ in the $z_1$ direction formed of a lower triangular matrix decomposing the matrix [h (i, j)] and P one-dimensional digital filters $2_0, 2_1, 2_2, \ldots, 2_{(p-1)}$ in the $z_2$ direction formed of an upper triangular matrix, connected in series. Signal data is entered in parallel to the one-dimensional digital filters $1_0, 1_1, 1_2, \ldots, 1_{(p-1)}$. The outputs thereof are entered to the two-dimensional digital filters $2_0, 2_1, 2_2, \ldots, 2_{(p-1)}$. The respective outputs are summed up by adders $3_0, 3_1, 3_2, \ldots 3_{(P-1)}$ to be output.

LU decomposition is specifically indicated in the following equation (2).

$$[1\, z_2^{-1}\, z_2^{-2}] \begin{bmatrix} 3 & 6 & 3 \\ 1 & 6 & 4 \\ 1 & 2 & 1 \end{bmatrix} \begin{bmatrix} 1 \\ z_1^{-1} \\ z_1^{-2} \end{bmatrix} = \quad (2)$$

$$[1\, z_2^{-1}\, z_2^{-2}] \begin{bmatrix} 3 & 0 & 0 \\ 1 & 1 & 0 \\ 1 & 0 & 0 \end{bmatrix} \begin{bmatrix} 1 & 2 & 1 \\ 0 & 4 & 3 \\ 0 & 0 & 0 \end{bmatrix} \begin{bmatrix} 1 \\ z_1^{-1} \\ z_1^{-2} \end{bmatrix}$$

In the matrix [h (i, j)] above representing the properties of a two-dimensional digital filter, elements 363 of the 0 row are triplicities of elements 121, respectively, of the second row. They are dependent and have the rank of 2. Therefore, the elements in the second column in the lower triangular matrix, and the elements in the second row in the upper triangular matrix are all 0. Therefore, the formation of a two-dimensional digital filter as shown in equation (2) according to LU decomposition results in the structure shown in FIG. 5 where two one-dimensional digital filters are connected serially in the horizontal direction and the vertical direction. Referring to FIG. 5, a one-dimensional digital filter 4 has $[1, z_1^{-1}, z_1^{-2}]$ multiplied by [1, 2, 1], a one-dimensional digital filter 5 has [3, 1, 1] multiplied by $[1, z_2^{-1}, z_2^{-}]$, a one-dimensional digital filter 6 has [0, 4, 3] multiplied by $[1, z_1^{-1}, z_1^{-2}]$, and a one-dimensional digital filter 7 has [0, 1, 0] multiplied by $[1, z_2^{-1}, z_2^{-2}]$. The outputs of one-dimensional digital filters 5 and 7 are added in an adder 8, whereby an output is obtained.

FIG. 6 shows a hardware structure based on the block diagram of FIG. 5. Referring to FIG. 6, D represents a delay circuit of the $z_1$ direction (horizontal direction). It is formed of a data latch, for example, to store one signal data. 1H represents a delay circuit of the $z_2$ direction (vertical direction). It is formed of a FIFO memory, for example, to store signal data of 1 scan line. The multiplier in one-dimensional digital filter 4 multiplies a coefficient 2 by the output of the delay circuit to calculate $2z_1^{-1}$.

When a two-dimensional digital filter formed by LU decomposition is to be realized on a data driven type processor, the delay circuit D of the horizontal direction can be realized by a generation number operation which is the data identifier in the signal data. The delay circuit 1H of the vertical direction preferably employs an external storage device such as a FIFO memory since the amount of data to be stored is great.

FIG. 7 shows a signal processing system using a data driven type processor. Referring to FIG. 7, signal input data sampled in the raster scan direction is input sequentially from a data transmission path 27 or 28 to a data driven type processor 21. Data driven type processor 21 has pre-specified procedures stored therein by which processing is carried out. A memory interface 22 receives via a data transmission path 24 an access (reference/update of image memory) request to an image memory 23 from data driven type processor 21. After image memory 23 is accessed via a memory access control line 26, the result is returned to data driving type processor 21 via a data transmission path 25. Following the process of a signal input packet, data driven type processor 21 provides a signal output packet via a data transmission path 29 or 30. Data driven type processor 21 realizes the function of a FIFO memory by writing into image memory 23 input data of the vertical direction delay circuit 1H and reading out the same after a time elapse equal to the scanning of 1 line.

Thus, when a two-dimensional digital filter is formed according to LU decomposition, it can be appreciated as in the hatched path of FIG. 5 that one-dimensional digital filters 4 and 5 having the maximum number of terms in the horizontal and vertical directions are connected in series. Therefore, there is a problem that the delay of signal data between input and output is increased when hardware of a two-dimensional digital filter is formed by LU decomposition.

When a two-dimensional digital filter formed by LU decomposition is realized on a data driven type processor 21 as shown in FIG. 7, the frequency of access to image memory 23 is increased due to the complex structure of the one-dimensional digital filter of the vertical direction. As a result, the number of executions at data driven type processor 21 is increased. Furthermore, there was a problem that a high speed memory access is required for image memory 23 to be used as an external storage device.

SUMMARY OF THE INVENTION

In view of the foregoing, the main object of the present invention is to provide a digital filter allowing simplification of the structure of a one-dimensional digital filter of the vertical direction as compared to that of the horizontal direction.

A two-dimensional digital filter according to the present invention carries out, by a plurality of digital filters, one-dimensional filtering in the raster scan direction on a signal input in the raster scan format. Multiplication is carried out, if necessary, with respect to the output of the one-dimensional digital filter. Using delay means, time delay is generated for the output of the one-dimensional digital filter or the multiplication means in the raster scan direction. Then, the output of the one-dimensional digital filter, the multiplication means, or the delay means is summed up by adder means. Therefore, the one-dimensional digital filter of the vertical direction is simplified in comparison with the structure of the horizontal direction, and the delay time between input and output is reduced.

Thus, according to the present invention, the delay time between input and output can be reduced in comparison with the case where the horizontal direction and the vertical direction are treated equally by carrying out a decomposition such that a one-dimensional digital filter of the vertical direction is simplified as compared with that of the horizontal direction. In the case where a data driven type processor is employed, the usage of an external storage device such as a FIFO memory for a delay circuit of the vertical direction allows a decrease in the frequency of access to the memory. Therefore, the entire processing amount can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
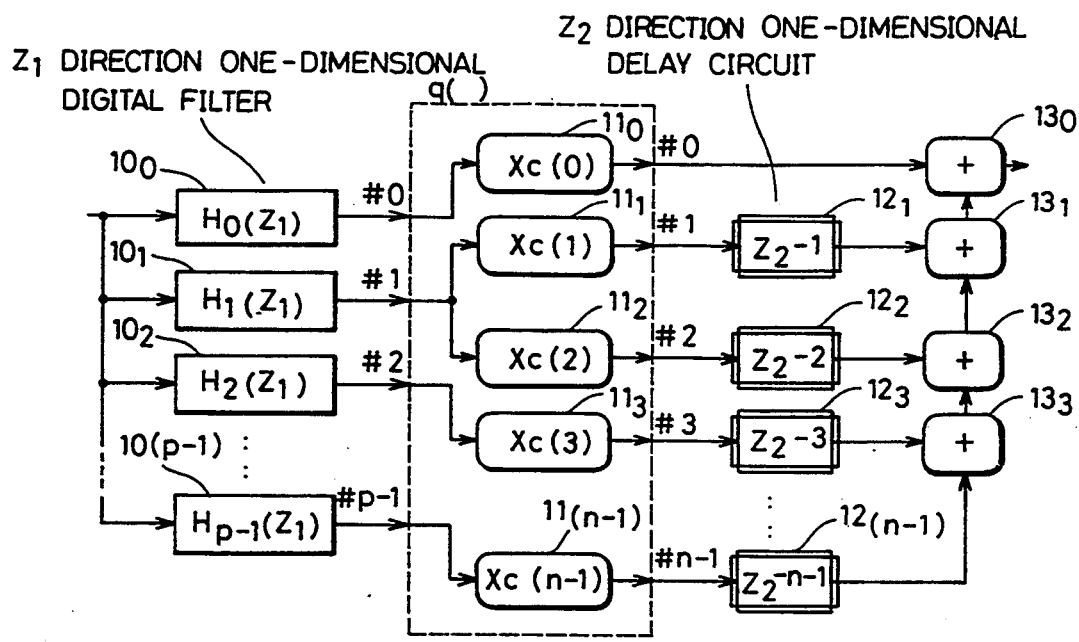
FIG. 1 shows a two-dimensional digital filter according to an embodiment of the present invention.

FIG. 1 shows a two-dimensional digital filter according to an embodiment of the present invention, The two-dimensional digital filter of FIG. 1 is formed according to the decomposition rule of a two-dimensional digital filter indicated in the following equation (3).

$$H(z_1, z_2) = \sum_{i=0}^{m-1} \sum_{j=0}^{n-1} h(i,j) z_1^{-i} z_2^{-j} = \quad (3)$$

$$\sum_{j=0}^{n-1} \left( \sum_{i=0}^{m-1} h_{q(j)}(i) z_1^{-i} \right) c(j) z_2^{-j}$$

$$p = \text{rank}([h(i,j)])$$

q(j): function of row position j before degeneracy to row position after degeneracy c(j): ratio of value of row position j before degeneracy to value of row position q(j) after degeneracy Equation (3) shows a method in which a matrix [h (i, j)] exhibiting the properties of a two-dimensional digital filter degenerates on the basis of a row vector. If "rank ([h (i, j)])" of matrix [h (i, j)] is p, the row vector degenerates into p. Therefore, there will be p one-dimensional digital filters $10_0, 10_1, 10_2, \ldots, 10_{(p-1)}$ in the horizontal direction.

The connection structure of multipliers $11_0, 11_1, 11_2, 11_3, \ldots, 11_{(n-1)}$ enclosed by a dotted line in FIG. 1 is determined by a function q(J) and a function c(j) representing the degeneracy status set forth in the following. FIG. 1 shows the degeneracy of the first and second rows in matrix [h (i, j)]. The outputs of multipliers $11_0, 11_1, 11_2, 11_3, \ldots, 11_{(n-1)}$ pass through vertical direction delay circuits $12_1, 12_2, 12_3, \ldots, 12_{(n-1)}$ of respectively different dimension to be added in adders $13_0, 13_1, 13_2, 13_3, \ldots$ Thus, the output of a two-dimensional filter is obtained.

The function q(j) of equation (3) indicates the row in which the row position J, before degeneracy, corresponds to after degeneracy. The function c(j) indicates the ratio of the value in row position j before degeneracy to the value in a corresponding row position $q(j)$ after degeneracy.

The decomposition of a two-dimensional digital filter is specifically indicated in the following equation (4).

$$H(z_1, z_2) = [1 \; z_2^{-1} \; z_2^{-2}] \begin{bmatrix} 3 & 6 & 3 \\ 1 & 6 & 4 \\ 1 & 2 & 1 \end{bmatrix} \begin{bmatrix} 1 \\ z_1^{-1} \\ z_1^{-2} \end{bmatrix} \quad (4)$$

$p = \text{rank}([h(i,j)]) = 2$  Matrix after degeneracy: $\begin{bmatrix} 1 & 2 & 1 \\ 1 & 6 & 4 \end{bmatrix}$ $$q(0) = 0, \; q(1) = 1, \; q(2) = 0$$

$$c(0) = 3, \; c(1) = 1, \; c(2) = 1$$

$$H_0(z_1) = [1 \; 2 \; 1] \begin{bmatrix} 1 \\ z_1^{-1} \\ z_1^{-2} \end{bmatrix}, \; H_1(z_1) = [1 \; 6 \; 4] \begin{bmatrix} 1 \\ z_1^{-1} \\ z_1^{-2} \end{bmatrix}$$

Degeneracy is possible in the matrix [h (i, j)] of equation (4) because row 0 and row 2 are dependent on each other. Accordingly, the rank of matrix [h (i, j)] is 2. When row 0 and row 2 degenerate to produce a degenerated matrix as shown in equation (4), the row 0 value before degeneracy corresponds to row 0 after degeneracy. Therefore, q(0)=0. Similarly, row 1 before degeneracy corresponds to row 1 after degeneracy, so that q(1)=1. Also, row 2 before degeneracy corresponds to row 0 after degeneracy, so that q(2)=0.

The value in row 0 before degeneracy is three times the value in row q(0) after degeneracy, i.e. row 0, so that c(0)=3. Similarly, the value of row 1 before degeneracy is equal to the value in row q(1) after degeneracy, i.e. row 1, so that c(1)=1. The value in row 2 before degeneracy is identical to the value in row q(2) after degeneracy, i.e. row 0, so that c(2)=1. The one-dimensional digital filters of the horizontal direction become $H_0(z_1)$, $H_1(z_1)$ of equation (4) using the matrix after degeneracy.

The connection between one dimensional digital filters $10_0$, $10_1$, $10_2$, ..., $10_{(p-1)}$ of the horizontal direction and delay circuits $12_1$, $12_2$, $12_3$, ..., $12_{(n-1)}$ of the vertical direction is carried out according to the function q(j). More specifically, the output of the dotted line portion having the number j is connected to the output of a multiplier having a multiplicator of c(j), and the input of that multiplier is connected to the input of the dotted line portion having the number q(j). It is to be noted that the multiplier can be omitted if c(j)=1.

Figure 2:
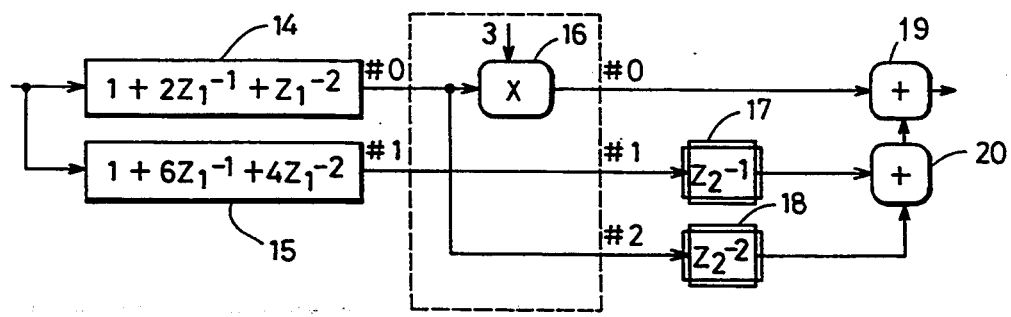
FIG. 2 is a block diagram specifically showing a two-dimensional filter of the present invention.

FIG. 2 is a block diagram of a two-dimensional digital filter formed on the basis of the example shown in equation (4). Referring to FIG. 2 and according to equation (4), the dotted line portion of the horizontal direction having the output number of 0 is connected to the output of a multiplier having a multiplicator of 3 by c(0)=3. The input of multiplier 16 is connected to the dotted line portion having an input number of 0 by q(0)=0, which is connected to the output of one-dimensional digital filter 14. Similarly, the dotted line portion of output number 1 has a multiplier omitted due to c(1)=1, and is connected to the dotted line portion of input number 1 due to q(1)=1, which is connected to the output of one-dimensional digital filter 15. Furthermore, the dotted portion of input number 2 has a multi-plier omitted due to c(2)=1, and is connected to the dotted line portion of input number 0 due to q(2)=0, which is connected to the output of one-dimensional digital filter 14. The dotted line portion at output number 0 is connected to the input of an adder 19. The dotted line portion at output numbers 1 and 2 are connected to the inputs of delay circuits 17 and 18, respectively. The outputs of delay circuits 17 and 18 are added at an adder 20, and then further added with the output of multiplier 16 by adder 19.

Figure 3:
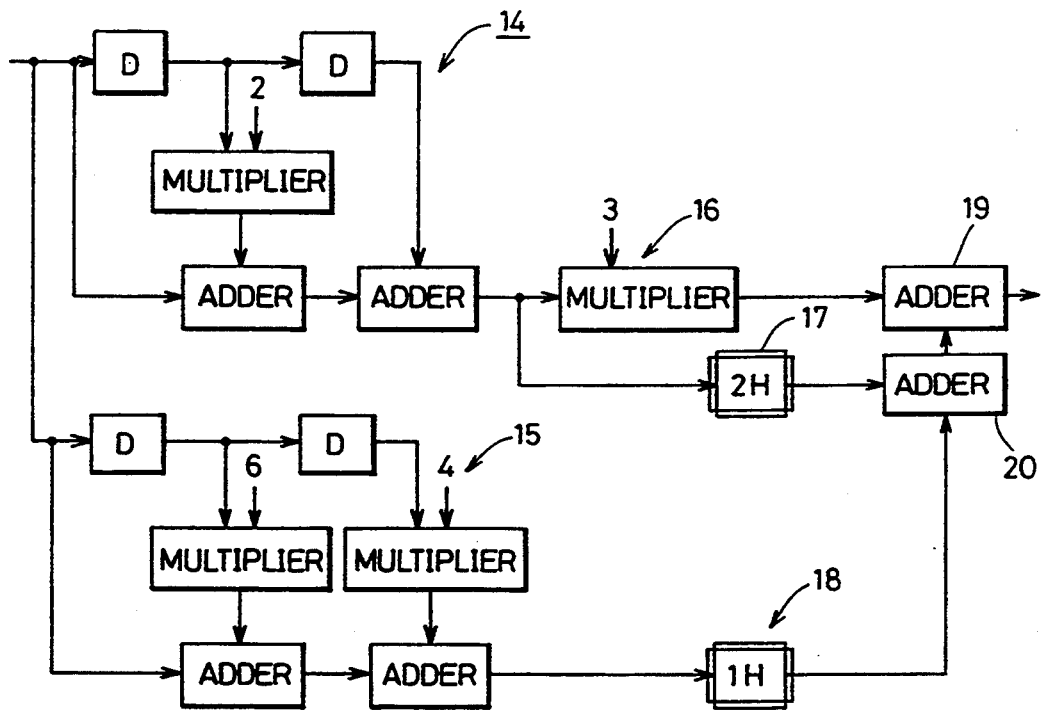
FIG. 3 shows a hardware circuit of the two-dimensional filter of FIG. 2.
Figure 4:
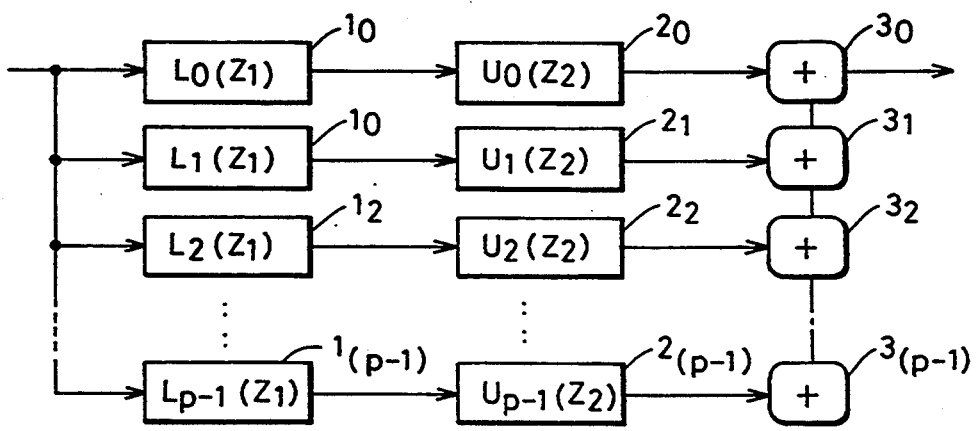
FIG. 4 shows a structure of a prior art two-dimensional digital filter.
Figure 5:
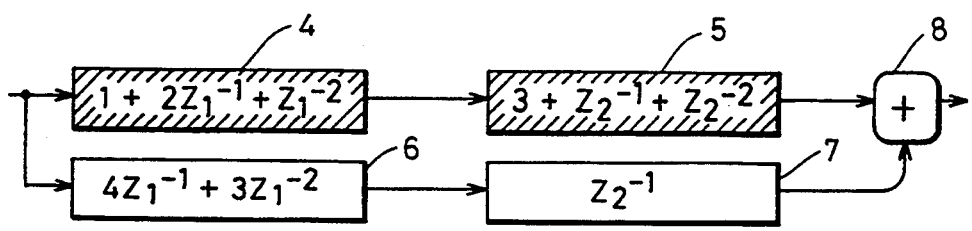
FIG. 5 is a block diagram specifically showing a prior art two-dimensional digital filter.

FIG. 3 shows the hardware circuit of the two-dimensional digital filter of FIG. 2. Similar to the description of FIG. 6, D represents a delay circuit of the $z_1$ direction (horizontal direction), such as a data latch, to store one signal data. 1H represents a delay circuit of the $z_2$ direction (vertical direction) for storing signal data of 1 scan line. Similarly, 2H represents a delay circuit of the $z_2$ direction (vertical direction) to store signal data of 2 scan lines. Delay circuits 1H and 2H can be formed of a FIFO memory, for example.

By comparing the structures of the two dimensional digital filter according to the embodiment of FIG. 3 and that of the prior art case it can be appreciated that the delay time between input and output is reduced in the embodiment of the present invention. This is due to simplification of the structure of the one-dimensional digital filter of the vertical direction requiring only 1 term in each dimension even though the one-dimensional digital filters in the present embodiment and the prior art case having the largest number of terms is equal in number.

Figure 6:
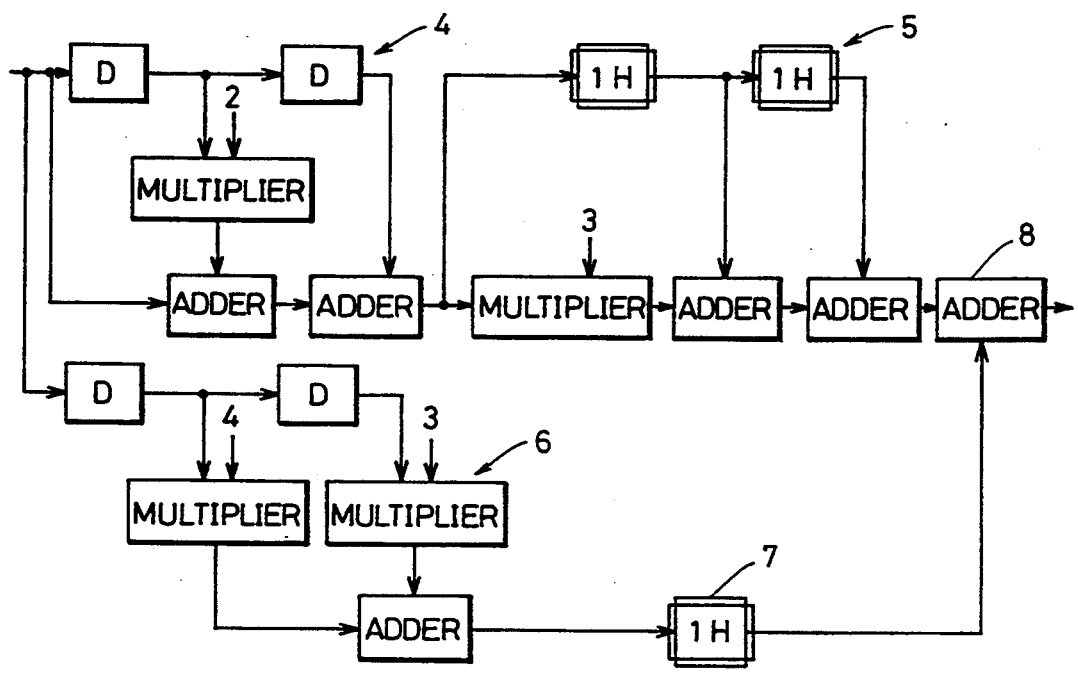
FIG. 6 shows a hardware circuit of the prior art two-dimensional digital filter of FIG. 5.
Figure 7:
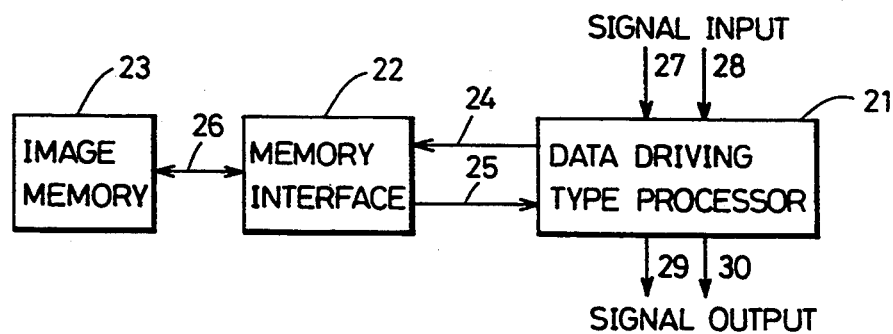
FIG. 7 shows a structure of a signal processing system using a prior art data driven type processor and using an embodiment of the present invention.

Referring to the prior art embodiment shown in FIG. 6, the digital filter of order 2 of the one-dimensional digital filters of the vertical direction also includes the term of order 1. It is therefore necessary to decompose the FIFO memory for each 1 line. In contrast, the one-dimensional digital filters of the vertical direction according to the embodiment of the present invention shown in FIG. 3 has only 1 term in each dimension. It is therefore not necessary to divide the FIFO memory. A digital filter for the term of degree 2 can be realized by a FIFO memory of 2 lines. Furthermore, the conventional two-dimensional digital filter of FIG. 6 requires 3 FIFO memories, whereas the two-dimensional digital filter of the present embodiment shown in FIG. 3 requires only 2 FIFO memories. This means that, when an external storage device of a FIFO memory is used as a delay circuit of the vertical direction by a data driving type processor, the frequency of access to the memory becomes ⅔ in the embodiment of the present invention. Therefore, the processing time required for memory access is also reduced to ⅔ in the present invention compared to that of the conventional case. This advantage becomes significant as the number of terms of a one-dimensional digital filter of the vertical direction increases.

Thus, according to an embodiment of the present invention, the delay time between input and output can be reduced by applying decomposition such that a one-dimensional digital filter of the vertical direction is more simplified than in the horizontal direction in comparison with the case where the horizontal direction and the vertical direction are addressed equally. When using a data driven type processor, the usage of a FIFO memory as an external storage device for a delay circuit of the vertical direction provides the advantage of reducing the frequency of access to the memory. Therefore, the entire processing amount can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A degenerate two-dimensional digital i X j filter of rank, r<i, formed by connecting in series one-dimensional digital filters, comprising:
   a plurality of one-dimensional digital filters, corresponding to rows of a degenerated r X j matrix degenerated from the i X j filter, respectively, for carrying out one-dimensional filtering in a raster scan direction for a signal data entered in a raster scan format;
   multiplier means for carrying out multiplication, according to a scale factor relation between each pair of dependent rows in the i X j filter, each pair of dependent rows including an independent row and a row dependent thereon as a linear multiple, on an output of said plurality of one-dimensional digital filters, respectively;
   delay means for generating time delay in a direction perpendicular to said raster scan direction or an output of said plurality of one-dimensional digital filters or an output of said multiplier means according to a correspondence relation between each row of the i X j filter and a row of the r X j matrix; an adder means for carrying out addition of an output of said one-dimensional digital filter, or said multiplier means, or said delay means.

2. A degenerate two-dimensional digital i X j filter of rank, r<i, comprising:
   a plurality of one-dimensional digital filters, corresponding to rows of a degenerated r X j matrix degenerated from the i X j filter, respectively, for carrying out one-dimensional filtering in a raster scan direction with respect to a signal data input in a raster scan format;
   multiplier means for multiplying an output signal of one of said plurality of one-dimensional digital filters by a predetermined coefficient;
   a plurality of delay means for generating time delay on respective output signals of said plurality of one-dimensional digital filters in a direction perpendicular to said raster scan direction, according to a correspondence relation between each row of the i X j filter and a row of the r X j matrix;
   adder means for adding an output signal of said multiplier means and an output signal of said plurality of delay means.

3. The two-dimensional digital filter according to claim 2, wherein each of said plurality of one-dimensional digital filters comprises
   a plurality of delay elements each connected in a cascade manner in a first stage,
   multiplier means for multiplying an output of a delay element of the first stage of said plurality of delay elements by a predetermined coefficient,
   first adder means for adding an output signal of said multiplier means and said input signal data, and
   second adder means for adding an output signal of a delay element of a next stage out of said plurality of delay elements and an output signal of said first adder means.

4. The two-dimensional digital filter according to claim 3, wherein said delay element comprises a data latch.

5. The two-dimensional digital filter according to claim 2, wherein said delay means comprises a FIFO memory.

6. A method of implementing a reduced i X j two-dimensional matrix digital filter having n rows and m columns in which rank, r, is less than i, comprising the steps of:
   degenerating the i X j matrix into a degenerated r X j matrix;
   forming a one-dimensional filter corresponding to each row of the r X j matrix;
   storing a correspondence relation between each row existing before degeneracy and a row existing after degeneracy;
   inputting an input to the reduced i X j two-dimensional matrix digital filter in parallel to each one-dimensional filter;
   selectively unit delaying, according to the stored correspondence relation, selected outputs of the r one-dimensional filters; and
   summing the delayed, and any non-delayed, filter outputs.

7. A method as in claim 6 further comprising the steps of:
   storing a scale factor relation between each pair of dependent rows of the i X j matrix, each pair of dependent rows including an independent row and a row dependent thereon as a linear multiple; and
   scaling, prior to any unit delay, the output of each one-dimensional filter according to the stored scale factor relation.

8. A reduced i X j two-dimensional matrix digital filter having i rows and m columns in which rank, r, is less than i, comprising:
   means for degenerating the i X j matrix into a degenerated r X j matrix;
   a one-dimensional filter corresponding to each row of the r X j matrix;
   row correspondence memory storing a correspondence relation between each row existing before degeneracy and a row existing after degeneracy;
   wherein an input of each one-dimensional filter is connected in parallel;
   unit delay circuits, selectively connected to outputs of their one-dimensional filters, according to the correspondence relation stored in the row correspondence memory; and
   an adder receiving the unit delayed, and any non-delayed, filter outputs.

9. An apparatus as in claim 8 further comprising:
   scale factor memory storing a scale factor relation between each pair of dependent rows in the i X j matrix, each pair of dependent rows including an independent row and a row dependent thereon as a linear multiple; and
   a multiplier, connected to the output of each one-dimensional filter prior to any unit delay circuit, multiplying according to the stored scale factor relation.

10. An apparatus as in claim 8, wherein:
    each unit delay circuit is a FIFO memory.

* * * * *